United States Patent
Hong et al.

(10) Patent No.: US 11,399,438 B2
(45) Date of Patent: Jul. 26, 2022

(54) POWER MODULE, CHIP-EMBEDDED PACKAGE MODULE AND MANUFACTURING METHOD OF CHIP-EMBEDDED PACKAGE MODULE

(71) Applicant: Delta Electronics (Shanghai) Co., Ltd., Shanghai (CN)

(72) Inventors: Shouyu Hong, Shanghai (CN); Qingdong Chen, Shanghai (CN); Ganyu Zhou, Shanghai (CN); Yan Chen, Shanghai (CN); Xiaoni Xin, Shanghai (CN); Pengkai Ji, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 241 days.

(21) Appl. No.: 16/731,078

(22) Filed: Dec. 31, 2019

(65) Prior Publication Data

US 2020/0221582 A1 Jul. 9, 2020

(30) Foreign Application Priority Data

Jan. 7, 2019 (CN) .......................... 201910013049.3

(51) Int. Cl.
*H05K 3/40* (2006.01)
*H05K 13/04* (2006.01)
(Continued)

(52) U.S. Cl.
CPC ............... *H05K 3/40* (2013.01); *H01L 23/28* (2013.01); *H01L 23/3107* (2013.01);
(Continued)

(58) Field of Classification Search
CPC ... H01L 23/28; H01L 23/3107; H01L 23/642; H01L 23/645; H01L 23/647; H01L 2924/15153; H05K 7/06; H05K 13/0413
See application file for complete search history.

(56) References Cited

U.S. PATENT DOCUMENTS

| 5,111,278 A | 5/1992 | Eichelberger |
| 6,627,984 B2 | 9/2003 | Bruce et al. |

(Continued)

FOREIGN PATENT DOCUMENTS

| CN | 101038880 A | 9/2007 |
| CN | 101330075 A | 12/2008 |

(Continued)

OTHER PUBLICATIONS

Corresponding China office action dated Jul. 21, 2021.
(Continued)

*Primary Examiner* — Peniel M Gumedzoe
(74) *Attorney, Agent, or Firm* — CKC & Partners Co., LLC

(57) ABSTRACT

The present disclosure provides a power module, a chip-embedded package module and a manufacturing method of the chip-embedded package module. The chip-embedded package module includes: a chip having a first surface and a second surface that are disposed oppositely; a first plastic member including a first cover portion and a first protrusion; and a second plastic member including a second cover portion and a second protrusion. A height difference discontinuous interface structure is formed between the top surface of the second protrusion and the second surface of the chip, which cuts off a passage for expansion of delamination at an edge position of the chip, thereby effectively suppressing generation of the delamination.

22 Claims, 12 Drawing Sheets

(51) Int. Cl.
*H05K 3/46* (2006.01)
*H05K 7/06* (2006.01)
*H01L 23/28* (2006.01)
*H01L 23/31* (2006.01)
*H01L 23/64* (2006.01)

(52) U.S. Cl.
CPC .......... *H01L 23/642* (2013.01); *H01L 23/645* (2013.01); *H01L 23/647* (2013.01); *H05K 3/4697* (2013.01); *H05K 7/06* (2013.01); *H05K 13/0413* (2013.01); *H01L 2924/15153* (2013.01)

(56) References Cited

U.S. PATENT DOCUMENTS

| | | | |
|---|---|---|---|
| 6,806,580 | B2 | 10/2004 | Joshi et al. |
| 7,173,333 | B2 | 2/2007 | Hata et al. |
| 8,736,040 | B2 | 5/2014 | Hauenstein et al. |
| 2001/0007287 | A1 | 7/2001 | Hoche |
| 2005/0161785 | A1 | 7/2005 | Kawashima et al. |
| 2006/0043549 | A1* | 3/2006 | Hsu .................. H01L 24/24 257/678 |
| 2006/0232942 | A1 | 10/2006 | Nakatsu et al. |
| 2007/0249102 | A1* | 10/2007 | Brunnbauer ........ H01L 23/3128 257/E23.178 |
| 2010/0194511 | A1 | 8/2010 | Kobayashi et al. |
| 2011/0127678 | A1 | 6/2011 | Shim et al. |
| 2011/0227223 | A1* | 9/2011 | Wu ..................... H01L 23/5389 257/738 |
| 2012/0014059 | A1 | 1/2012 | Zeng et al. |
| 2012/0161128 | A1 | 6/2012 | Macheiner et al. |
| 2013/0049137 | A1 | 2/2013 | Uno et al. |
| 2013/0094269 | A1 | 4/2013 | Maeda et al. |
| 2015/0055306 | A1 | 2/2015 | Burns et al. |
| 2015/0200050 | A1 | 7/2015 | Nakao et al. |
| 2016/0284789 | A1 | 9/2016 | Zuo et al. |
| 2017/0018348 | A1 | 1/2017 | Mak et al. |
| 2017/0062121 | A1 | 3/2017 | Yang et al. |
| 2017/0064808 | A1 | 3/2017 | Rizza et al. |
| 2017/0373133 | A1 | 12/2017 | Liao |
| 2018/0033732 | A1* | 2/2018 | Sakamoto ............ H01L 21/486 |
| 2018/0096780 | A1 | 4/2018 | Sekiguchi et al. |
| 2018/0102349 | A1 | 4/2018 | Cho |
| 2018/0130595 | A1 | 5/2018 | Choi et al. |
| 2018/0182945 | A1 | 6/2018 | Shimabukuro |
| 2018/0204741 | A1 | 7/2018 | Chew |

FOREIGN PATENT DOCUMENTS

| | | |
|---|---|---|
| CN | 100470785 C | 3/2009 |
| CN | 101378049 A | 3/2009 |
| CN | 101414602 A | 4/2009 |
| CN | 101483381 A | 7/2009 |
| CN | 101179066 B | 5/2010 |
| CN | 101790766 A | 7/2010 |
| CN | 101840769 A | 9/2010 |
| CN | 201655476 U | 11/2010 |
| CN | 102369790 A | 3/2012 |
| CN | 103298258 A | 9/2013 |
| CN | 103383891 A | 11/2013 |
| CN | 103681535 A | 3/2014 |
| CN | 103730434 A | 4/2014 |
| CN | 103887292 A | 6/2014 |
| CN | 104051363 A | 9/2014 |
| CN | 204348470 U | 5/2015 |
| CN | 104756611 A | 7/2015 |
| CN | 103187388 B | 4/2016 |
| CN | 105679738 A | 6/2016 |
| CN | 107086212 A | 8/2017 |
| CN | 107424980 A | 12/2017 |
| CN | 107919350 A | 4/2018 |
| CN | 108231607 A | 6/2018 |
| CN | 108962773 A | 12/2018 |
| EP | 2482312 A2 | 8/2012 |
| JP | 2009225612 A | 10/2009 |
| JP | 2014168038 A | 9/2014 |
| TW | I275150 B | 3/2007 |
| TW | 201537722 A | 10/2015 |

OTHER PUBLICATIONS

Corresponding India office action dated Oct. 25, 2021.
Corrected Notice of Allowability of U.S. Appl. No. 16/735,716 dated Dec. 9, 2021.
Corresponding China NOA issued on Jan. 20, 2022 with its translation.
Corresponding India Office Action dated Aug. 31, 2021.
The Office Action of U.S. Appl. No. 16/735,716 dated Sep. 10, 2021.
Machine translation of CN 101378049.
Corresponding US office action dated Mar. 19, 2021.
Corresponding India office action dated Apr. 7, 2021.
Corresponding China office action dated May 24, 2021.
Corresponding China office action dated Mar. 21, 2022 with its translation.

* cited by examiner

POWER MODULE, CHIP-EMBEDDED PACKAGE MODULE AND MANUFACTURING METHOD OF CHIP-EMBEDDED PACKAGE MODULE

CROSS-REFERENCE TO RELATED APPLICATION

This application claims priority to Chinese Patent Application No. 201910013049.3, filed on Jan. 7, 2019, which is hereby incorporated by reference in its entirety.

TECHNICAL FIELD

The present disclosure relates to a power module, a chip-embedded package module and a manufacturing method of the chip-embedded package module, which belong to the technical field of power electronics.

BACKGROUND

With rapid development of data processors, smart phones, and driverless cars, the requirements for power products also increase. In order to improve power density of a power module, for the existing power module, a conductive member in the power module and a chip placed in the conductive member are generally packaged together by the insulating plastic packaging material. However, during a packaging process, since the chip differs considerably from the insulating plastic packaging material in terms of coefficient of thermal expansion (CTE), an edge position of the chip is easily delaminated from the insulating plastic packaging material due to mismatch of CTEs, significantly affecting reliability of the power module.

SUMMARY

The present disclosure provides a power module, a chip-embedded package module and a manufacturing method of the chip-embedded package module, which solve the problem in the existing package module that the edge position of the chip is delaminated from the insulating plastic packaging material due to mismatch of coefficients of thermal expansion between the chip and the insulating plastic packaging material.

In a first aspect, the present disclosure provides a chip-embedded package module, including:

a chip having a first surface and a second surface that are disposed oppositely;

a first plastic member including a first cover portion and a first protrusion, where the first cover portion covers at least a portion of the first surface of the chip, the first protrusion covers a side surface of the chip, and a top surface of the first protrusion is coplanar with the second surface of the chip; and a second plastic member including a second cover portion and a second protrusion, where the second cover portion covers at least a portion of the second surface of the chip, the second protrusion is disposed on the side surface of the chip, and a top surface of the second protrusion is not coplanar with the second surface of the chip.

In a second aspect, the present disclosure provides a power module, including: the package module as described above and an inductor, where the inductor is electrically connected to a chip of the package module, and the inductor and the package module are disposed in a stacked manner.

In a third aspect, the present disclosure provides a manufacturing method of a chip-embedded package module, including:

providing a chip;

pressing a first plastic member on a first surface of the chip in such a manner that a first cover portion of the first plastic member covers at least a portion of the first surface of the chip, a first protrusion of the first plastic member covers a side surface of the chip, and the top surface of the first protrusion is coplanar with a second surface of the chip; and pressing a second plastic member on the second surface of the chip in such a manner that a second cover portion of the second plastic member covers at least a portion of the second surface of the chip, the second protrusion of the second plastic member is located on the side surface of the chip, and the top surface of the second protrusion is not coplanar with the second surface of the chip.

The chip-embedded package module according to present disclosure includes: a chip having a first surface and a second surface that are disposed oppositely; a first plastic member including a first cover portion and a first protrusion, where the first cover portion covers at least a portion of the first surface of the chip, the first protrusion covers a side surface of the chip, and a top surface of the first protrusion is coplanar with the second surface of the chip; and a second plastic member including a second cover portion and the second protrusion, where the second cover portion covers at least a portion of the second surface of the chip, the second protrusion is disposed on the side surface of the chip, and a top surface of the second protrusion is not coplanar with the second surface of the chip. In this way, a height difference discontinuous interface structure is formed between the top surface of the second protrusion and the second surface of the chip, which splendidly cuts off a passage for expansion of delamination at an edge position of the chip, thereby effectively suppressing generation of the delamination, and solving the problem in the existing package module that the edge position of the chip is delaminated from the insulating plastic packaging material due to mismatch of coefficients of thermal expansion between the chip and the insulating plastic packaging material.

BRIEF DESCRIPTION OF DRAWINGS

In order to describe technical solutions in embodiments of the present disclosure or the prior art more clearly, accompanying drawings used in the description of embodiments or the prior art will be briefly described hereunder. Obviously, the described drawings are merely some embodiments of present disclosure. For persons or ordinary skill in the art, other drawings may be obtained based on these drawings without any creative work.

FIG. 10b is a top plan view of FIG. 10a;

EXPLANATION TO REFERENCE NUMERALS

Figure 1A:
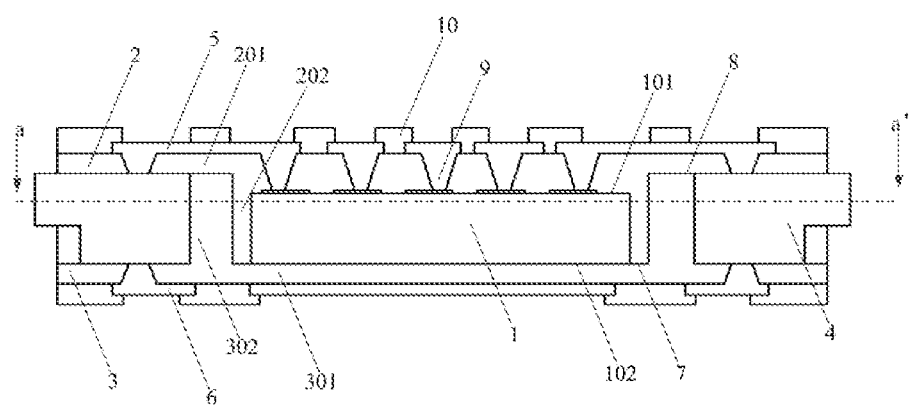
FIG. 1a is a cross-sectional view of a first structure of a chip-embedded package module according to a first embodiment of the present disclosure.

1—chip; 101—first surface; 102—second surface; 103—conductive metal layer; 104—first power terminal; 105—second power terminal; 106—third power terminal; 107—signal terminal; 111—first chip; 112—second chip;

2—first plastic member; 201—first cover portion; 202—first protrusion;

3—second plastic member; 301—second cover portion; 302—second protrusion;

4—metal block; 41—first power pin; 42—second power pin; 43—third power pin; 44—metal boss; 45—groove;

5—first metal wiring layer; 6—second metal wiring layer;

7—first interface; 8—second interface; 9—conductive hole;

10—solder mask layer; 104'—first power pad; 105'—second power pad; 106'—third power pad; 108'—inductor output pad;

11—printed circuit board (PCB) substrate; 115—PCB core plate; 116—PCB copper layer;

12—component;

13—third plastic piece; 14—capacitor; 15—copper column; 16—inductor;

17—conductive column; 18—metal frame; 19—connector.

DESCRIPTION OF EMBODIMENTS

In order to make objectives, technical solutions, and advantages of embodiments of the present disclosure clearer, the technical solutions in the embodiments of the present disclosure will be described hereunder clearly and comprehensively with reference to the accompanying drawings in the embodiments of the present disclosure. Obviously, the described embodiments are a part of embodiments of the present disclosure, rather than all embodiments of the present disclosure. All other embodiments obtained by persons of ordinary skill in the art based on the embodiments of the present disclosure without any creative effort shall fall into the protection scope of the present disclosure.

In the description of the present disclosure, it is to be understood that an orientation or positional relationship indicated by terms such as "on", "down", "left", and "right" is based on the orientation or positional relationship shown in the drawings, only for ease of description of the present disclosure and simplification of the description, rather than indicating or implying that an indicated device or element must have a particular orientation and is configured and operated in the particular orientation, which thus should not be construed as limiting the present disclosure.

Moreover, terms such as "first" and "second" are used for descriptive purposes only, which cannot be construed as indicating or implying a relative importance or implicitly indicating the number of technical features indicated. Thus, features defined with "first" or "second" may include at least one of the features, either explicitly or implicitly. In the description of the present disclosure, unless expressly defined otherwise, the meaning with regard to "a plurality of" indicates at least two, such as two, three, etc.

Moreover, in the description of this specification, different technical features and different embodiments are only exemplified, which do not mean that the technical features in these embodiments or hereinafter dispersed between the same or different embodiments can be used only under the following exemplary conditions, and they can be freely combined without departing from the objective of the present disclosure, while these combinations also fall into the scope of the present disclosure.

With rapid development of data processors, smart phones, and driverless cars, the requirements for power products also increase. In order to improve power density of a power module, for the existing power module, a conductive member in the power module and a chip placed in the conductive member are generally packaged together by the insulating plastic packaging material. However, during the package, since the chip differs considerably from the insulating plastic packaging material in terms of coefficient of thermal expansion (CTE), the edge position of the chip is easily delaminated from the insulating plastic packaging material due to mismatch of CTEs, significantly affecting reliability of the power module.

In order to solve the problem in the existing package module that the edge position of a chip is delaminated from the insulating plastic packaging material due to mismatch of coefficients of thermal expansion between the chip and the insulating plastic packaging material, the first embodiment of the present disclosure provides a chip-embedded package module.

Figure 1B:
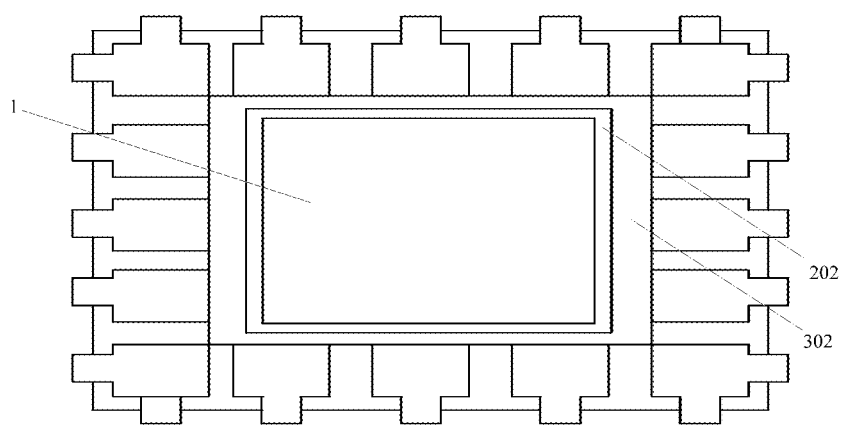
FIG. 1b is a cross-sectional view along line a-a' of the chip-embedded package module according to the first embodiment of the present disclosure, wherein the chip-embedded package module's second protrusion has a first structure.
Figure 1C:
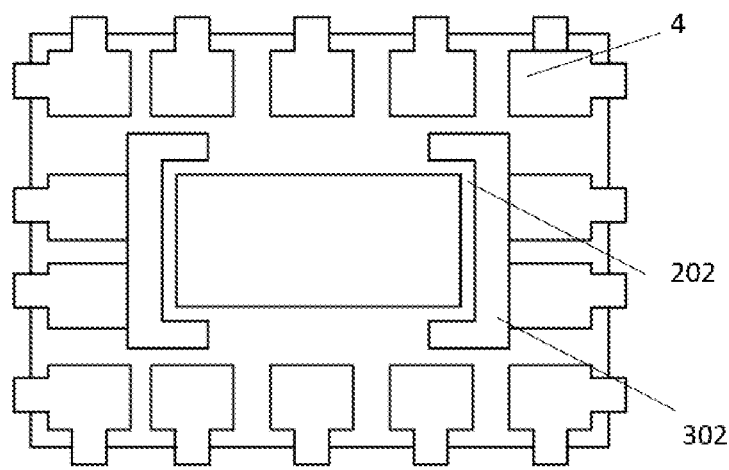
FIG. 1c is a cross-sectional view along line a-a' of the chip-embedded package module according to the first embodiment of the present disclosure is a second structure, wherein the chip-embedded package module's second protrusion has a second structure.
Figure 1D:
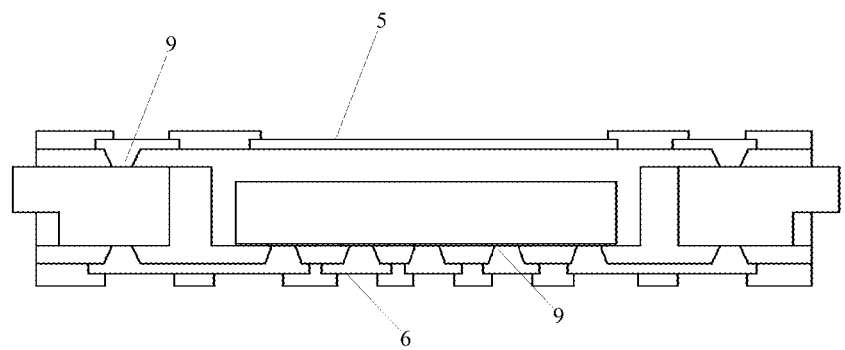
FIG. 1d is a cross-sectional view of a second structure of the chip-embedded package module according to the first embodiment of the present disclosure.

FIG. 1a is a cross-sectional view of a first structure of a chip-embedded package module according to the first embodiment of the present disclosure; FIG. 1b is a cross-sectional view along line a-a' of the chip-embedded package module according to the first embodiment of the present disclosure, wherein the chip-embedded package module's second protrusion has a first structure; FIG. 1c is a cross-sectional view along line a-a' of the chip-embedded package module according to the first embodiment of the present disclosure, wherein the chip-embedded package module's second protrusion has a second structure; and FIG. 1d is a cross-sectional view of a second structure of the chip-embedded package module according to the first embodiment of the present disclosure;

As shown in FIG. 1a and FIG. 1b, the chip-embedded package module provided in the first embodiment includes: a chip 1, a first plastic member 2, and a second plastic member 3. The chip 1 has a first surface 101 and a second surface 102 that are disposed oppositely, where the first surface 101 is an electrode surface of the chip 1, and the second surface 102 is a silicon substrate surface; the first plastic member 2 includes a first cover portion 201 and a first protrusion 202, where the first cover portion 201 covers at least a portion of the first surface 101 of the chip 1, the first protrusion 202 covers a side surface of the chip 1, and a top surface of the first protrusion 202 is coplanar with the second surface 102 of the chip 1; and the second plastic member 3 includes a second cover portion 301 and a second protrusion 302, where the second cover portion 301 covers at least a portion of the second surface 102 of the chip 1, the second protrusion 302 is disposed on the side surface of the chip 1, and a top surface of the second protrusion 302 is not coplanar with the second surface 102 of the chip 1.

Specifically, the first surface 101 (excluding a conductive hole 9) and the side surface of the chip Tare covered by the first plastic member 2, and the second surface 102 of the chip 1 is covered by the second plastic member 3. Among others, the top surface of the second protrusion 302 on the side surface of the chip 1 is not coplanar with the second surface 102 of the chip 1, forming a height difference; the second protrusion 302 of the second plastic member 3 is allowed to effectively cut off a passage for expansion of delamination at an edge position of the chip 1, thereby effectively suppressing generation of the delamination, and solving the problem in the existing package module that the edge position of a chip is delaminated from the insulating plastic packaging material due to mismatch of coefficients of thermal expansion between the chip and the insulating plastic packaging material.

Optionally, the top surface of the second protrusion 302 abuts against the first plastic member 2, and the top surface of the first protrusion 202 abuts against the second plastic member 3. Interfaces formed by the first plastic member 2 and the second plastic member 3 include a first interface 7 and a second interface 8. The first interface 7 is formed by the top surface of the first protrusion 202 of the first plastic member 2 and the second plastic member 3, the first interface 7 is aligned with the second surface 102 of the chip 1; and the second interface 8 is formed by the top surface of the second protrusion 302 of the second plastic member 3 and the first plastic member 2. The second interface 8 is higher than the second surface 102 of the chip 1 in height, that is, the first interface 7 and the second interface 8 constitute a height difference discontinuous interface. Since an edge or sharp corner position of the second surface 102 of the chip 1 is extremely easy to delaminate, the second protrusion 302 of the second plastic member 3 is disposed at a position around the side of the chip 1 and near the chip 1, so that the continuous interface which is coplanar with the second surface 102 of the chip 1 is blocked by the second protrusion 302 of the second plastic member 3, and such a discontinuous interface structure that is formed can splendidly cut off the passage for expansion of delamination at the edge position of the chip 1, thereby effectively suppressing generation of the delamination.

Optionally, the top surface of the second protrusion 302 is not only higher than the second surface 102 but also higher than the first surface 101, that is, the height difference between the second interface 8 and the first interface 7 is larger, and it is of greater possibility to effectively prevent delamination at the edge of the chip 1.

Optionally, the first protrusions 202 and the second protrusions 302 are adjacently disposed, so that the discontinuous interface structure formed between the first plastic member 2 and the second plastic member 3 is more stable, and it is of greater possibility to effectively improve the problem pertaining to interface delamination between the chip 1 and the second plastic members 3, improving reliability of the power module.

Optionally, as shown in FIG. 1b, the structure formed by the second interface 8 which is formed by the top surface of the second protrusion 302 of the second plastic member 3 and the first plastic member 2 is a closed structure, that is, the second protrusion 302 covers a long side, a short edge, and a corner of the chip 1, which thus can effectively suppress generation of edge delamination of all circumferences of the chip 1. In order to save costs, the second interface may also be provided only at a local weak position of the chip 1.

Optionally, as shown in FIG. 1c, the second protrusion 302 is disposed along a side surface on which the short edge and the corner of the chip 1 are located. When the chip 1 has a relatively large aspect ratio, in the chip 1, thermal mismatch accumulated in a long side direction is much greater than that in a short edge direction, and the delamination appears to be generated from the short edge position and expands along the long side direction; besides, since the corner position is highly prone to stress concentration, it is also easier to induce interface delamination, mainly characterized by generating from the corner position and expanding in a certain direction, for example, an angle between a crack and the long side is 30 to 45 degrees. Therefore, the second protrusion 302 is disposed on a side surface where the short edge and the corner position of the chip 1 are located, so that the top surface of the second protrusion 302 and the first plastic member 2 form the second interface 8, and the second interface 8 and the first interface 7 are height difference and discontinuous, thereby suppressing the delamination phenomenon along the long side direction of the chip 1, saving costs and making the distribution of the second protrusion 302 more flexible.

Optionally, the chip-embedded package module in the first embodiment further includes a metal block 4 that serves as a conductive member, a first metal wiring layer 5, and a second metal wiring layer 6. Among others, the metal block 4 is a component of a metal frame 18, where the metal frame 18 is used for accommodating the chip 1, the metal block 4 is disposed on the side surface of the chip 1, and the second protrusion 302 is located between the metal block 4 and the chip 1; the first metal wiring layer 5 is disposed on a surface of the first plastic member 2 facing away from the chip 1, and the first metal wiring layer 5 is electrically connected to an electrode terminal of the chip 1; the second metal wiring layer 6 is disposed on a surface of the second plastic member 3 facing away from the chip 1, and the second metal wiring layer 6 is electrically connected to an electrode terminal of the chip 1. Optionally, a lower surface of the metal block 4 is coplanar with the second surface 102 of the chip 1; an upper surface of the metal block 4 is coplanar with the top surface of the second protrusion 302, and is higher than the first surface 101 of the chip 1.

Optionally, the first metal wiring layer 5 and the second metal wiring layer 6 are connected through conductive hole 9 above and below the chip 1 and the metal block 4 respectively, meanwhile a solder mask layer 10 may be directly formed on the bottom and the top of the package module. The solder mask layer 10 may define a pad of a surface mount component. Specifically, the electrode terminal of the chip 1 is distributed on an upper surface of the chip 1, and the electrode terminal of the chip 1 is electrically connected, via the conductive hole 9, to the first metal wiring layer 5 above the chip 1. The electrode of the chip 1 may also be electrically connected to the metal block 4 via the conductive hole 9 after being electrically connected, via the conductive hole 9, to the first metal wiring layer 5 above the chip 1, and then electrically connected to the second metal wiring layer 6 below via the conductive hole 9 below the metal block 4; thus upper and lower conduction of a circuit is achieved, moreover, a high current may pass the metal block 4, and the flow capacity is strong.

It should be further noted that, in this embodiment, the electrode terminal of the chip may be distributed on the upper surface of the chip 1, that is, the electrode faces upward. However, the electrode terminal of the chip may also be distributed on a lower surface of the chip 1, that is, the electrode faces downward, as shown in FIG. 1d. Principles of the specific circuit conduction are similar to those illustrated in the above-mentioned case that the electrode of the chip is distributed on the upper surface of the chip 1, and will not be described herein again.

Figure 2:
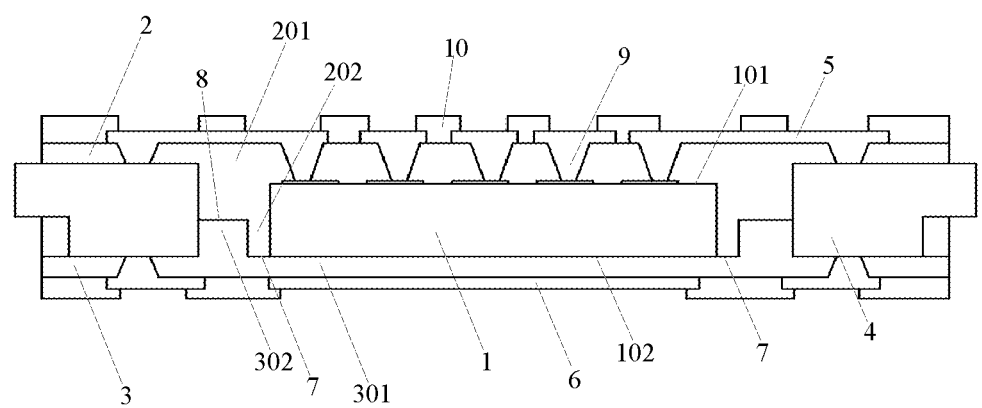
FIG. 2 is a cross-sectional view of a chip-embedded package module according to a second embodiment of the present disclosure.

FIG. 2 is a cross-sectional view of a chip-embedded package module according to a second embodiment of the present disclosure. As shown in FIG. 2, the chip-embedded package module of this embodiment differs from the chip-embedded package module of the first embodiment in that the top surface of the second protrusion 302 is higher than the second surface 102 and lower than the first surface 101 of the chip 1 so that the second interface 8 formed by the top surface of the second protrusion 302 and the first plastic member 2 is located between the upper and lower surfaces of the chip 1, in this way, the first plastic member 2 only needs to fill a part of thickness of the entire chip 1 during molding, so that filling effects are better and the distribution is more uniform. Such improvement effects will directly induce a lower process stress, thereby increasing carrying capacity of the first plastic member 2, and also improving strength of the second interface 8 accordingly. Therefore, it is possible to further improve the delamination at the edge of the chip.

Figure 3:
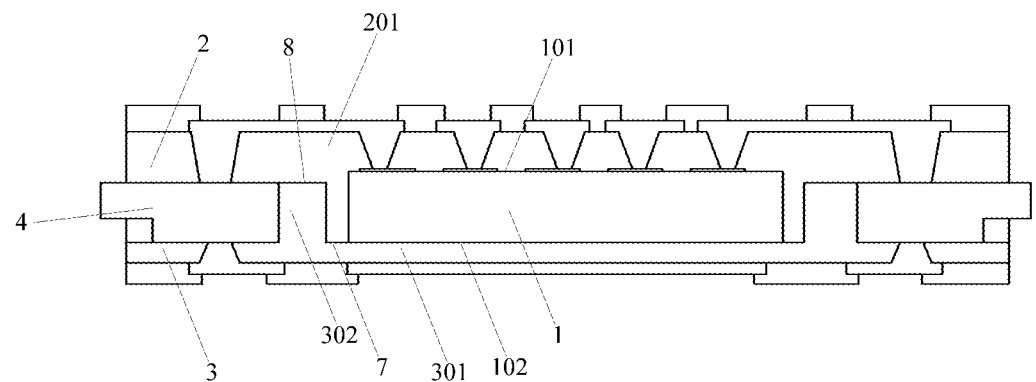
FIG. 3 is a cross-sectional view of a chip-embedded package module according to a third embodiment of the present disclosure.

FIG. 3 is a cross-sectional view of a chip-embedded package module according to a third embodiment of the present disclosure. As shown in FIG. 3, on the basis of the first embodiment, in the chip-embedded package module of this embodiment, the upper surface of the metal block 4 is lower than the first surface 101 of the chip 1 in height, so that the top surface of the second protrusion 302 of the second plastic member 3 will be lower than the first surface 101 of the chip 1 in height. Such an arrangement can still ensure that the first interface 7 and the second interface 8 are height difference and discontinuous, which effectively blocks a passage for expansion of delamination at an edge position of the chip 1, thereby suppressing occurrence of delamination.

Figure 4A:
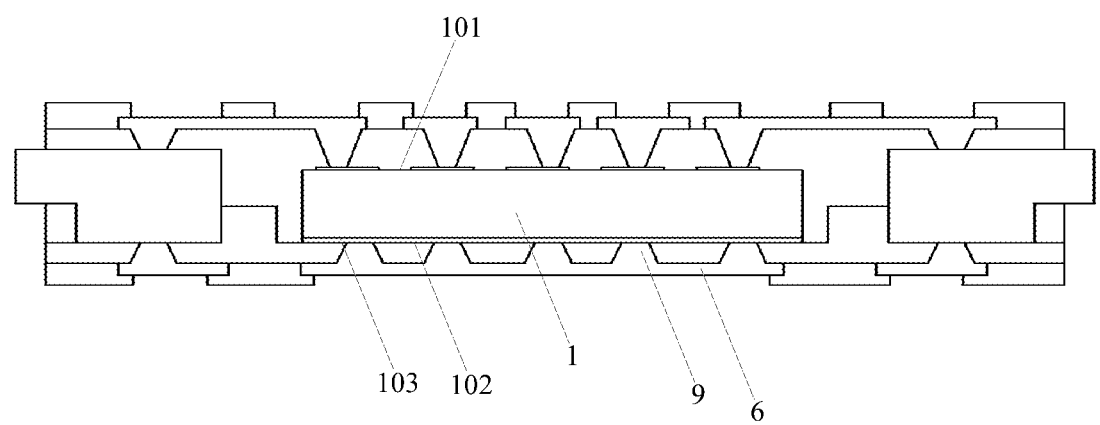
FIG. 4a is a cross-sectional view of a first structure of a chip-embedded package module according to a fourth embodiment of the present disclosure.
Figure 4B:
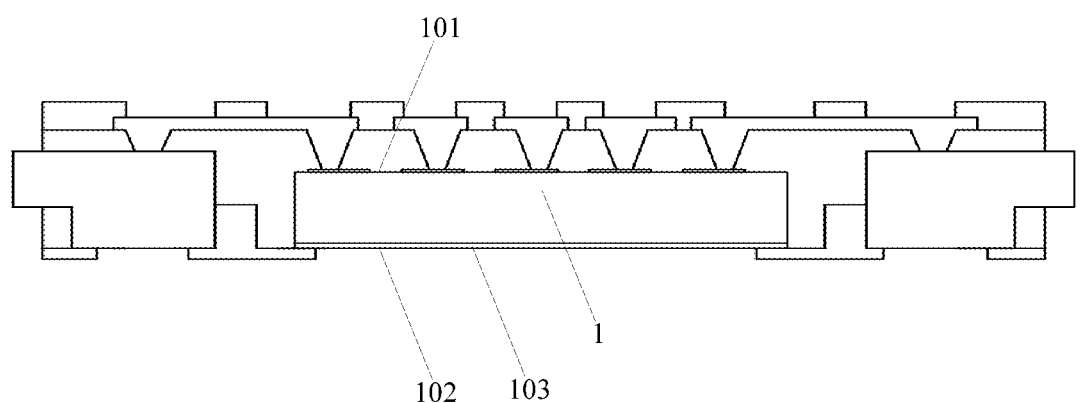
FIG. 4b is a cross-sectional view of a second structure of the chip-embedded package module according to the fourth embodiment of the present disclosure.

FIG. 4a is a cross-sectional view of a first structure of a chip-embedded package module according to a fourth embodiment of the present disclosure; and FIG. 4b is a cross-sectional view of a second structure of the chip-embedded package module according to the fourth embodiment of the present disclosure. In the above embodiments, the chip 1 includes a bare die, and an upper surface and a lower surface of the bare die serve as the first surface 101 and the second surface 102 of the chip 1, respectively. As shown in FIG. 4a, on the basis of each of the above embodiments, the chip 1 of this embodiment includes a bare die and a conductive metal layer 103 covering the bare die, the first surface 101 of the chip 1 is formed on a side of the bare die away from the conductive metal layer 103, and the second surface 102 of the chip 1 is formed on a side of the conductive metal layer 103 away from the bare die. Among others, the conductive metal layer 103 may be a copper layer bonded, soldered or plated on the bare die. In addition, the conductive metal layer 103 may partially cover a non-electrode surface opposite to an electrode surface of the bare die. In this way, the second surface 102 of the chip 1 may be connected to the second metal wiring layer 6 via the conductive hole 9 to form a downward heat transfer path; thus heat dissipation to the outside is achieved from both the first surface 101 and the second surface 102 of the chip 1, and heat dissipation efficiency of the package module is greatly improved.

Optionally, as shown in FIG. 4b, there may be no need to provide the conductive hole 9 and the second metal wiring layer 6 at the bottom of the second surface 102 of the chip 1, and the conductive metal layer 103 is in direct contact with the outside. Compared with FIG. 4a, the conductive metal layer 103 in this embodiment is in direct contact with the outside, that is, there is no a conductive hole 9 and a second metal wiring layer 6 at the bottom of the second surface 102 of the chip 1, in this way, not only an overall height of the package module can be effectively reduced, but also heat dissipation efficiency of the package module can be improved. However, it is also possible to greatly reduce the contact area between the second plastic member 3 and the second surface 102 of the chip 1, and a mutual restraint between second plastic member 3 and the chip 1 is reduced; moreover, compared with FIG. 4*a*, the package structure in FIG. 4*b* is more asymmetrical, which is easier to induce th chip 1 to delaminate, at an edge, from the second plastic member 3. Therefore, through mutual embedding of the first plastic member 2 and the second plastic member 3, a height difference is formed between the top surface of the first protrusion 202 and the top surface of the second protrusion 302, thereby cutting off expansion of delamination of the chip 1. It is possible to significantly improve the delamination problem and improve reliability of the module.

As shown in FIG. 1 to FIG. 4*a*, the listed package structures are all symmetric stack structures, that is, the metal wiring layer above the chip 1 has a same number of layers as the metal wiring layer below the chip 1, for example, both of these have one layer. Such a symmetrical structure produces a small warpage and can effectively improve the process yield. It should be noted that in other embodiments, the metal wiring layer above the chip 1 and the metal wiring layer below may also be of the same number of layers, or of different number of layers, alternatively, there may be at least one metal wiring layer only above or below the chip 1.

Figure 5A:
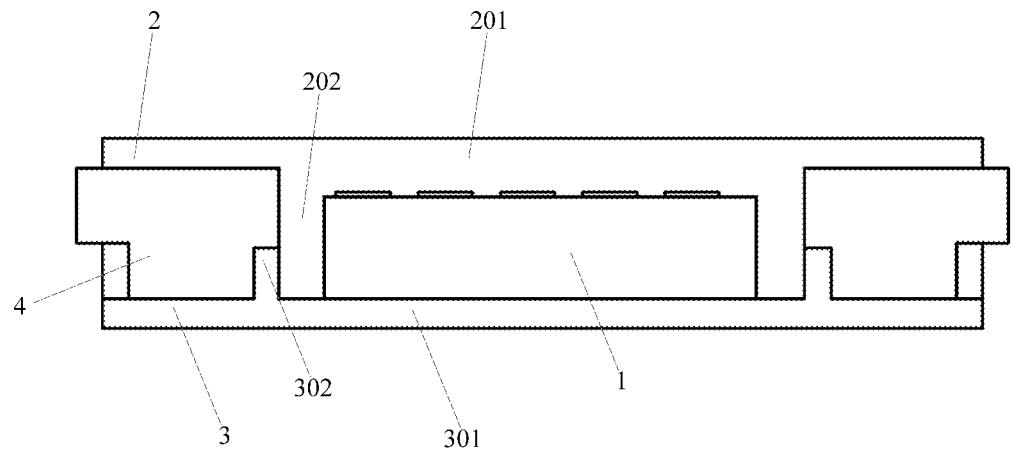
FIG. 5a is a cross-sectional view of a first structure of a chip-embedded package module according to a fifth embodiment of the present disclosure.
Figure 5B:
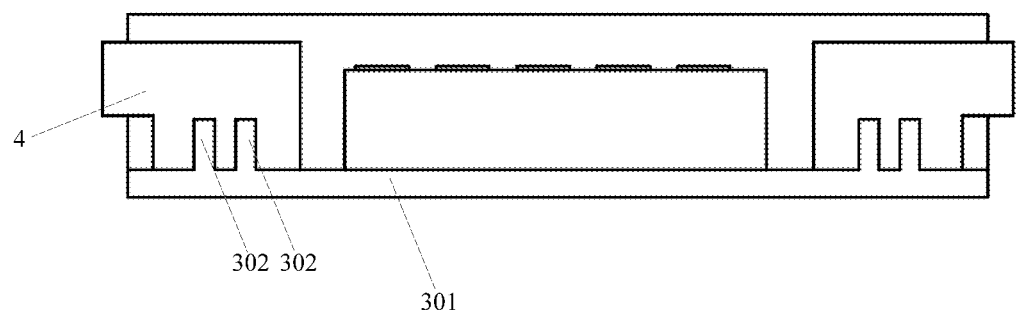
FIG. 5b is a cross-sectional view of a second structure of the chip-embedded package module according to the fifth embodiment of the present disclosure.

FIG. 5*a* is a cross-sectional view of a first structure of a chip-embedded package module according to a fifth embodiment of the present disclosure; and FIG. 5*b* is a cross-sectional view of a second structure of the chip-embedded package module according to the fifth embodiment of the present disclosure. As shown in FIG. 5*a*, the second protrusion 302 of the second plastic member 3 in this embodiment is disposed at a position different from that in each of the above embodiments. In this embodiment, a surface of the metal block 4 contacting with the second plastic member 3 is formed with a groove into which the second protrusion 302 extends, so that a connection between the second plastic member 3 and the metal block 4 is more stable, and the problem pertaining to the delamination at the edge of the chip 1 is further improved. Optionally, in order to ensure a better bonding structure between the protrusion 302 of the second plastic member 3 and the metal block 4, a plurality of grooves are formed on the surface of the metal block 4 contacting with the second plastic member 3, as shown in FIG. 5*b*, the plurality of second protrusions 302 can be covered by the metal block 4, which improves stability of the connection between the second plastic part 3 and the metal block 4 to a greater extent, thereby improving the problem pertaining to the delamination at the edge of the chip 1, and improving reliability of the package module.

Figure 6:
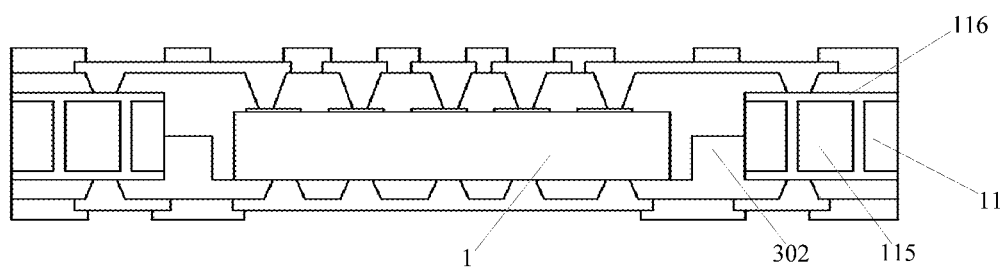
FIG. 6 is a cross-sectional view of a chip-embedded package module according to a sixth embodiment of the present disclosure.

FIG. 6 is a cross-sectional view of a chip-embedded package module according to a sixth embodiment of the present disclosure. As shown in FIG. 6, this embodiment differs from each of the above embodiments in that a PCB substrate 11 defined in the present embodiment is used instead of the metal block 4. Among others, the PCB substrate 11 may be a PCB double-sided copper-clad board, including a PCB core plate 115 and a PCB copper layer 116. Since the PCB core plate 115 is generally made of a reinforced composite and has high tensile strength, fracture resistance is strong; meanwhile since there are many types of PCB substrates and it is easy to find a material matching the CTE of the chip, a lower thermal stress will be generated when the package module is subjected to a temperature cycling load. Arrangement of the second protrusion 302 of the second plastic member 3 between the chip 1 and the PCB substrate 11 will further improve reliability of the structure.

Certainly, the groove may be provided on a surface on which the bottom of the PCB substrate is in contact with the second plastic member, and the second protrusion 302 of the second plastic member 3 extends into the interior of the PCB substrate 11 to achieve a multi-lock structure. For a specific fixation, reference may be made to the description of the relationship of connection between the metal block 4 and the second protrusion 302, and details will not be described herein again.

Figure 7:
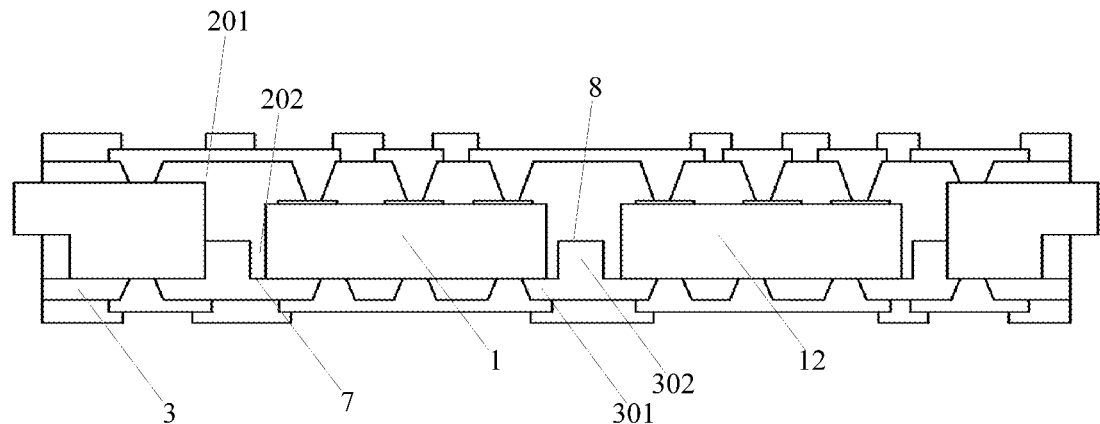
FIG. 7 is a cross-sectional view of a chip-embedded package module according to a seventh embodiment of the present disclosure.

FIG. 7 is a cross-sectional view of a chip-embedded package module according to a seventh embodiment of the present disclosure. As shown in FIG. 7, on the basis of each of the above embodiments, the chip-embedded package module in this embodiment further includes a component 12, where the component 12 is disposed on the side surface of the chip 1, and at least a portion of the second protrusion 302 is located between the component 12 and the chip 1 to form a second interface 8 between the chip 1 and the component 12. The second interface 8 coincides with that in each of the above embodiments, that is, the surface formed between the top surface of the second protrusion 302 and the first plastic member 2.

Relative to the vertical stack structure, the component 12 is placed coplanar with the chip 1, which can effectively reduce the overall height of the package module. When the component 12 is a chip, the two chips are placed on the plane in a manner more flexibly. An electrode surface of the chip may face either upward or downward. The two chips may be placed in parallel and coplanar, that is, in the same layer. Due to arrangement of the component 12, the package module is highly prone to delamination at edges of the component 12 and the chip 1, thus the second protrusion 302 of the second plastic member 3 is disposed between the chip 1 and the component 12 so that a passage for expansion of delamination at edge positions of the chip 1 and the component 12 is blocked by the second protrusion 302, thereby forming a discontinuous interface that is coplanar with bottom surfaces of the chip 1 and the component 12, effectively suppressing generation of delamination at the edges of the chip and the component, and improving reliability.

Figure 8:
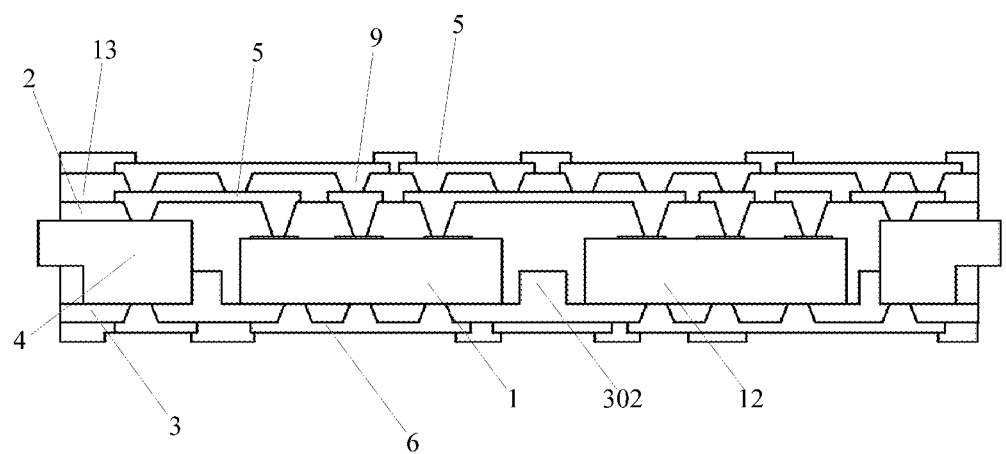
FIG. 8 is a cross-sectional view of a chip-embedded package module according to an eighth embodiment of the present disclosure.

FIG. 8 is a cross-sectional view of a chip-embedded package module according to an eighth embodiment of the present disclosure. As shown in FIG. 8, on the basis of each of the above embodiments, the chip-embedded package module in the this embodiment, two layers of first metal wiring layer 5 are disposed above the chip 1 and one layer of second metal wiring layer 6 is disposed below the chip 1. Among others, a third plastic member 13 is disposed on a side of the first plastic member 2 facing away from the chip 1. The first metal wiring layer 5 at the uppermost of the package module is disposed on the third plastic member 13 which is connected to the adjacent first metal wiring layer 5 via the conductive hole 9.

Two layers of first metal wiring layer 5 are disposed above the chip 1, and one layer of second metal wiring layer 6 is disposed below the chip 1. Such an asymmetric structure leads the degree of CTE mismatch between the material above the chip 1 and the chip 1 to be greater than the degree of CTE mismatch between the material below the chip 1 and the chip 1, this macroscopically appears to cause a warpage above the chip 1 so that the interface formed between the second plastic member 3 and the chip 1 is pulled by the upper structure, that is, subject to a large stress. Therefore, a second protrusion 302 of the second plastic member 3 are disposed between the chip 1 and the metal block 4, and/or between the chip 1 and the component 12, which can well suppress generation and expansion of delamination.

It can be seen from each of the above embodiments that the second protrusion 302 of the second plastic member 3 may be disposed between the chip 1 and a conductive member such as the metal block 4, the PCB substrate 11 etc., or between the chip 1 and the component 12, so that the top surface of the second protrusion 302 and the top surface of the first protrusion 202 form a discontinuous plane, thereby suppressing generation and expansion of delamination. The component 12 may be a chip, a resistor or a capacitor, but is not limited thereto.

Figure 9A:
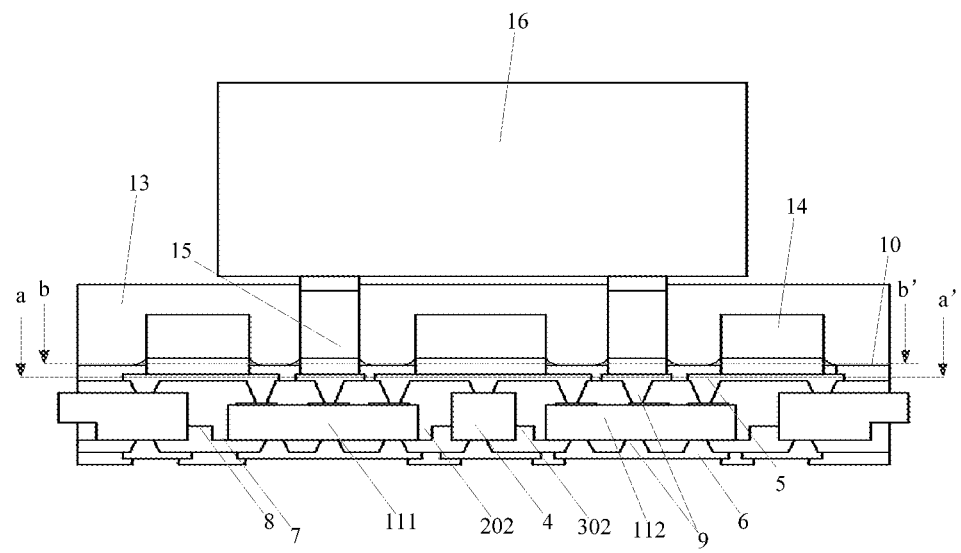
FIG. 9a is a cross-sectional view of a first structure of a chip-embedded package module according to a ninth embodiment of the present disclosure.
Figure 9B:
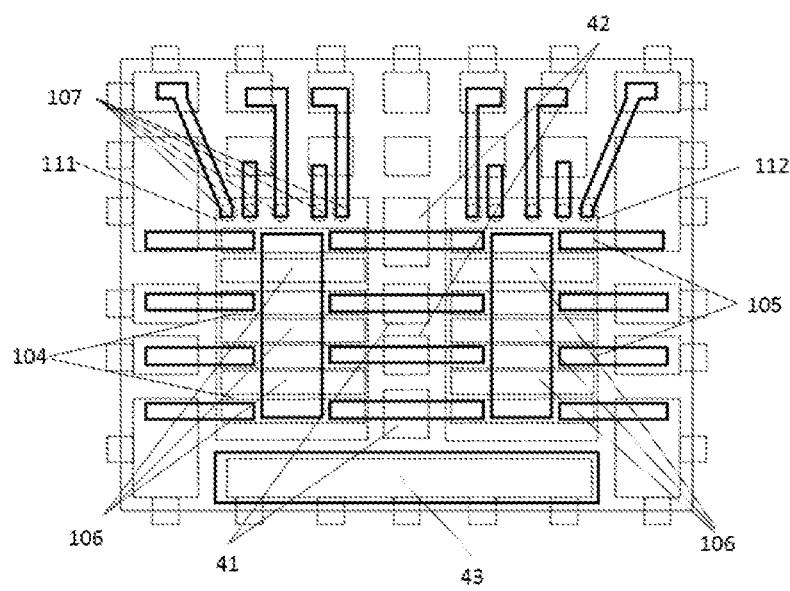
FIG. 9b is a cross-sectional view along line a-a' of the first structure of the chip-embedded package module according to the ninth embodiment of the present disclosure.

FIG. 9a is a cross-sectional view of a first structure of a chip-embedded package module according to a ninth embodiment of the present disclosure; FIG. 9b is a cross-sectional view along line a-a' of the first structure of the chip-embedded package module according to the ninth embodiment of the present disclosure; and FIG. 9c is a cross-sectional view along line b-b' of the first structure of the chip-embedded package module according to the ninth embodiment of the present disclosure.

As shown in FIG. 9a, on the basis of each of the above embodiments, the chip-embedded package module in this embodiment includes two chips 1, that is, a first chip 111 and a second chip 112, and the first chip 111 and the second chip 112 are provided coplanar. An input capacitor 14 and a copper column 15 are soldered on a solder mask layer 10 at the top of the package module, and an inductor 16 is soldered on the copper column 15. At this point, the inductor 16, the capacitor 14 and the copper column 15 are stacked vertically in the chip 1, and the capacitor 14 and the copper column 15 are packaged within the third plastic member 13. The package module, the capacitor 14 and the inductor 16 together form a power module. In the package module, the copper column 15 not only functions to connect the inductor 16 with the chip 1, but also has a large current passed therethrough, fully meeting requirements of the inductor.

As shown in FIG. 9b, the inside of the package module in this embodiment includes a first chip 111 and a second chip 112. Each chip is integrated with at least two switch transistors, and the at least two switch transistors are connected in series to form half bridge circuits. Each half bridge circuit has a first power terminal 104, a second power terminal 105, a third power terminal 106, and a signal terminal 107. A metal block 4 is disposed between the first chip 111 and the second chip 112 when the first power terminal 104 is an input terminal VIN, the second power terminal 105 is a ground terminal GND, and the third power terminal 106 is an output terminal SW. The metal block 4 includes a first power pin 41 and a second power pin 42. The first power pin 41 is electrically connected to first power terminals (VIN) of the first chip 111 and the second chip 112 through a portion of the first metal wiring layer 5, and the second power pin 42 is electrically connected to second power terminals (GND) of the first chip 108 and the second chip 109 through a remaining portion of the first metal wiring layer 5; moreover, the first power pin 41 and the second power pin 42 are alternative arranged, so that current equilibrium is achieved between the first chip 111 and the second chip 112.

Figure 9C:
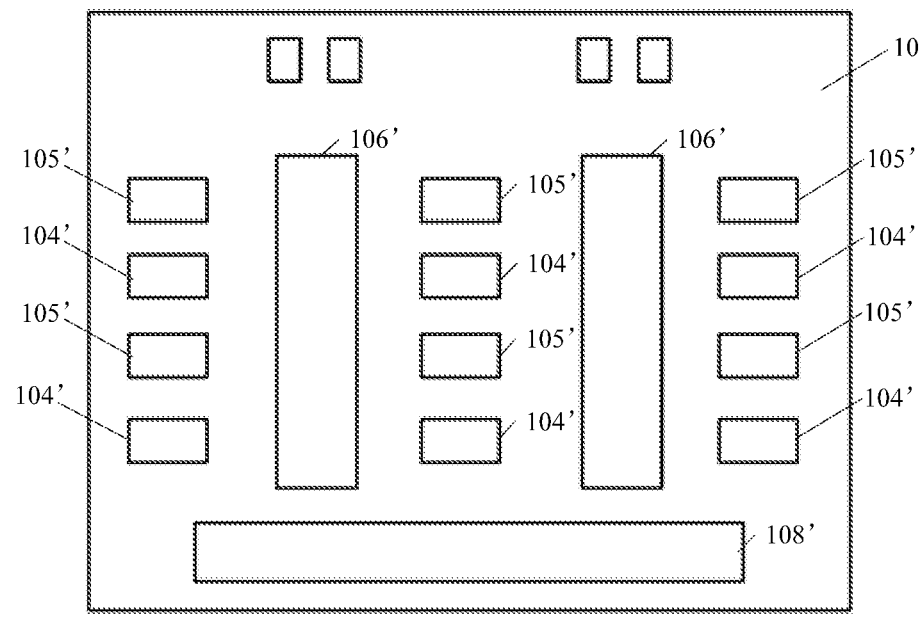
FIG. 9c is a cross-sectional view along line b-b' of the first structure of the chip-embedded package module according to the ninth embodiment of the present disclosure.

As shown in FIG. 9c, a third power pads 106' corresponding to the third power terminals 106 (SW) of the first chip 111 and the second chip 112 are formed directly above the package module, respectively. Specifically, the third power pad 106' of the first chip 111 is electrically connected to the third power terminal 106 (SW) of the first chip 111 via the conductive hole 9 directly; the third power pad 106' of the second chip 112 is electrically connected to the third power terminal 106 (SW) of the second chip 112 via the conductive hole 9 directly; then, the third power pads 106' are connected to an input terminal of the inductor 16 through the copper column 15. This connection path is short with small impedance and high efficiency, the structure is compact, and heat dissipation effects are also very good. The metal wiring layer above and below the two chips are directly connected to the solder mask layer on the surface layer. This double-sided pin-out mode facilitates implementation of the stack structure and facilitates improvement of power density of the power module.

It should be noted that the distribution of the power terminal 104, the power terminal 105, the power terminal 106 and the signal terminal 107 of the first chip 111 and the second chip 112 is not limited to that shown in FIG. 9b.

With continued reference to FIG. 9c, in this embodiment, a first power pad 104' and the second power pad 105' corresponding to the first power terminal 104 (VIN) and a second power terminal 105 (GND) may be distributed around the first chip 111, around the second chip 112, and between the first chip 111 and the second chip 112; moreover, the first power pad 104' and the second power pad 105' are closely and alternately arranged, which is beneficial to reduce parasitic inductance of the loop. An inductor output pad 108' is connected to an output terminal of the inductor and is connected to the third power pin 43 via the conductive hole 9. The third power pin 43 is connected to the second metal wiring layer 6 via the conductive hole 9 below, and finally an output terminal of the entire power module is formed below the module. The first power pad 104' is short-circuited by the first power terminals 104 (VIN) of the first chip 111 and the second chip 112, and can be drawn out from both left side and right side of each chip 1. Such arrangement may allow for short current paths for inputs and outputs of two Buck circuits connected in parallel, good symmetry for two-phase circuits, good coupling effects for input circuits, good current equilibrium, and small impedance; also, heat dissipation at the top and the bottom can be achieved simultaneously, and various components in the package module may achieve a stacking arrangement, saving space occupation in the horizontal direction.

With continued reference to FIG. 9a, the capacitor 14 may be disposed at an intermediate symmetrical position between the first chip 111 and the second chip 112, and electrically connected to a metal block between the two chips through the first metal wiring layer 5 so as to achieve short and symmetrical circuit paths between the capacitor 14 and the two chips 1. When the two-phase circuits are connected in parallel, current equilibrium and mutual coupling together with ripple cancellation may be further achieved, efficiency is improved and it is suitable to operate at a higher frequency.

With continued reference to FIG. 9b, in order to draw out signal terminals 107 of the first chip 111 and the second chip 112, a plurality of rows of metal blocks 4 may be disposed as signal pins around the two chips. Not only electrodes are nearly drawn out, but also the wiring is flexible; this is especially suitable for a case where the number of chip electrodes is large and the size of the module is limited.

It can be seen from FIG. 9a that, in order to solder the inductor 16, it is necessary to introduce the copper column 15 to separate from the capacitor 14, and then solder the inductor 16 after injection molding. Thus, the thickness of the formed plastic part very large and, relative to the chip 1, interface delamination between the chip 1 and the second plastic member 3 is easily aggravated due to exacerbation of upper and lower asymmetry of the structure. Therefore, the second protrusion 302 is disposed on the second plastic member 3, and the second protrusion 302 extends between the chip 1 and the metal block 4, so that the second interface 8 formed by the second protrusion 302 and the first plastic member 2 and the first interface 7 formed by the first protrusion 202 and the second plastic member 3 form a height difference and discontinuous interface structure, which can effectively improve the delamination problem and improve reliability.

Figure 9D:
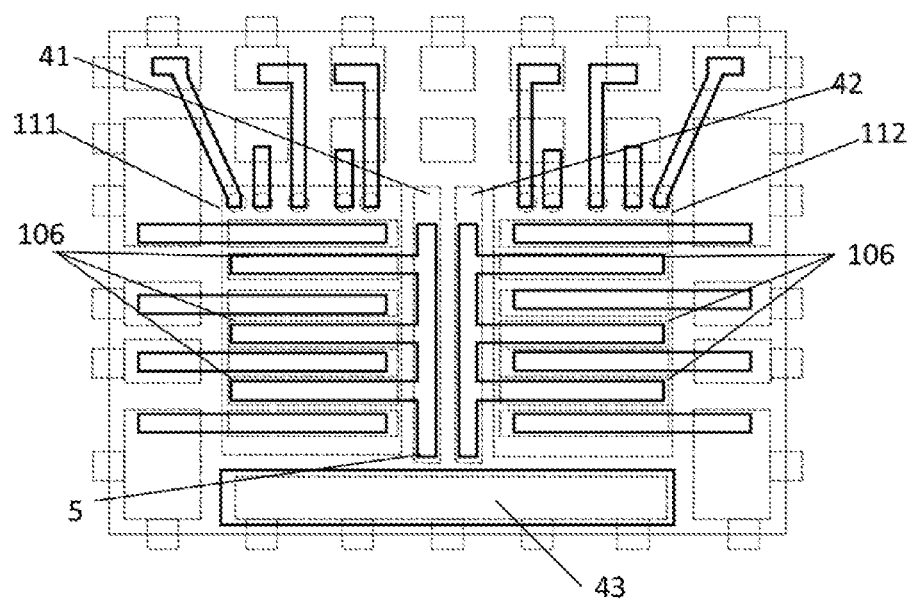
FIG. 9d is a cross-sectional view along line a-a' of a second structure of the chip-embedded package module according to the ninth embodiment of the present disclosure.
Figure 9E:
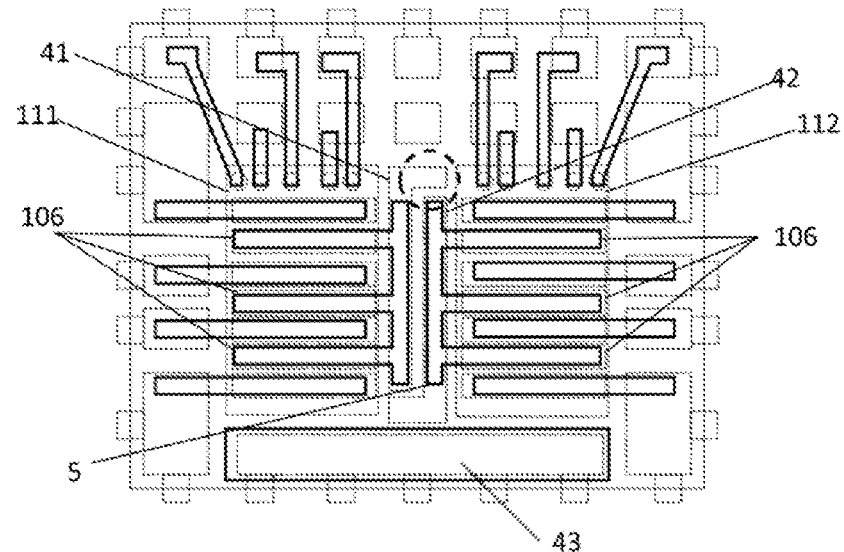
FIG. 9e is a cross-sectional view along line a-a' of a third structure of the chip-embedded package module according to the ninth embodiment of the present disclosure.

FIG. 9d is a cross-sectional view along line a-a' of a second structure of the chip-embedded package module according to the ninth embodiment of the present disclosure; FIG. 9e is a cross-sectional view along line a-a' of a third structure of the chip-embedded package module according to the ninth embodiment of the present disclosure; and FIG. 9f is a cross-sectional view along line a-a' of a fourth structure of the chip-embedded package module according to the ninth embodiment of the present disclosure.

Optionally, as shown in FIG. 9d, the first power pin 41 is electrically connected to a plurality of third power terminals 106 (SW) of the first chip 111, the second power pin 42 is electrically connected to a plurality of third power terminals 106 (SW) of the second chip 112, then the first power pin 41 and the second power pin 42 are electrically connected to an input terminal of the inductor via the conductive hole 9 and the first metal wiring layer 5, then the first power pin 41 and the second power pin 42 are electrically connected to the third power pin 43 through the first metal wiring layer 5 and the conductive hole 9 after a magnetic core and windings of the inductor are passed through, and finally electrically connected to the bottom of the module to form an output terminal of the entire power module.

Optionally, as shown in FIG. 9e, the first power pin 41 and the second power pin 42 are set to a lock structure (shown in a dashed circle), which may further improve reliability of the structure of the module.

Figure 9F:
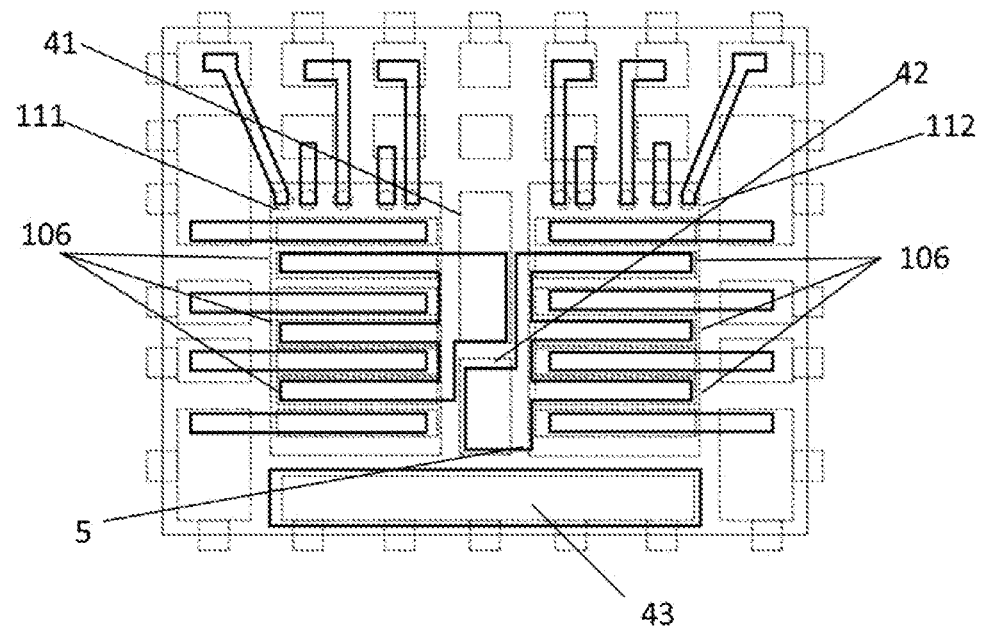
FIG. 9f is a cross-sectional view along line a-a' of a fourth structure of the chip-embedded package module according to the ninth embodiment of the present disclosure.

Optionally, as shown in FIG. 9f, reduction of an aspect ratio of the first power pin 41 or the second power pin 42 may also improve reliability of the structure of the module.

Figure 10A:
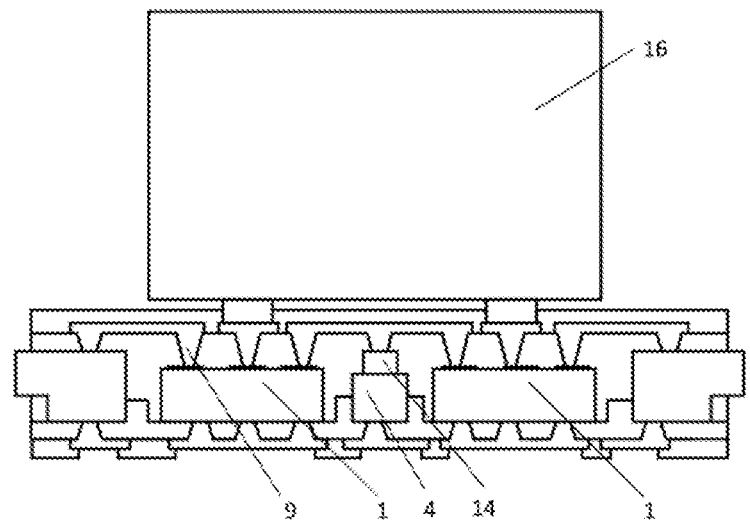
FIG. 10a is a cross-sectional view of a first structure of a chip-embedded package module according to a tenth embodiment of the present disclosure.
Figure 10B:
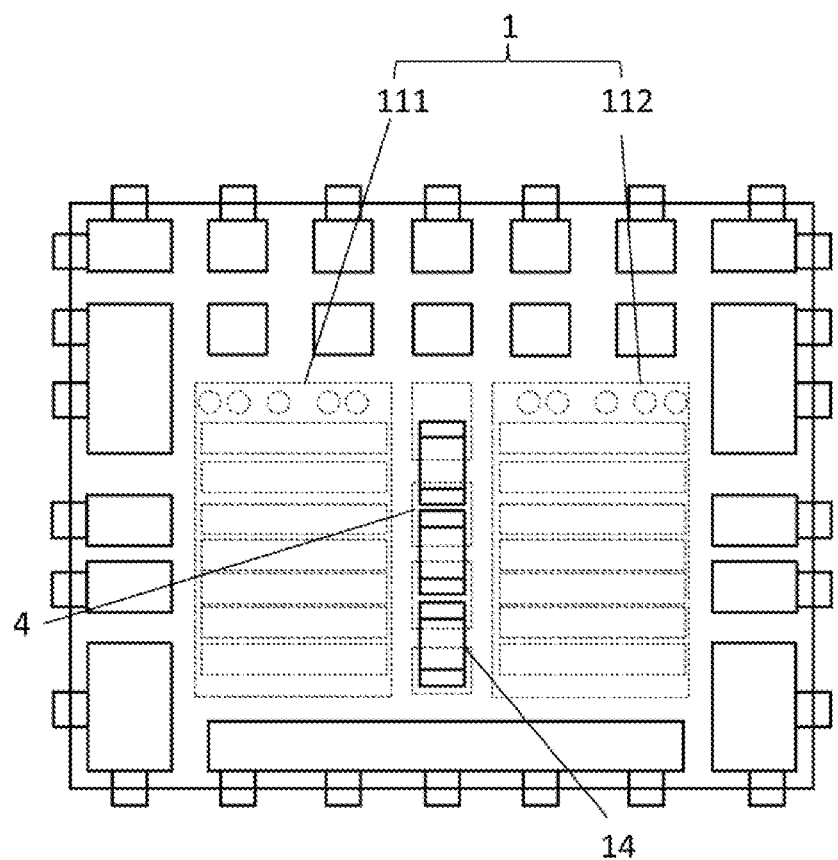
Figure 10C:
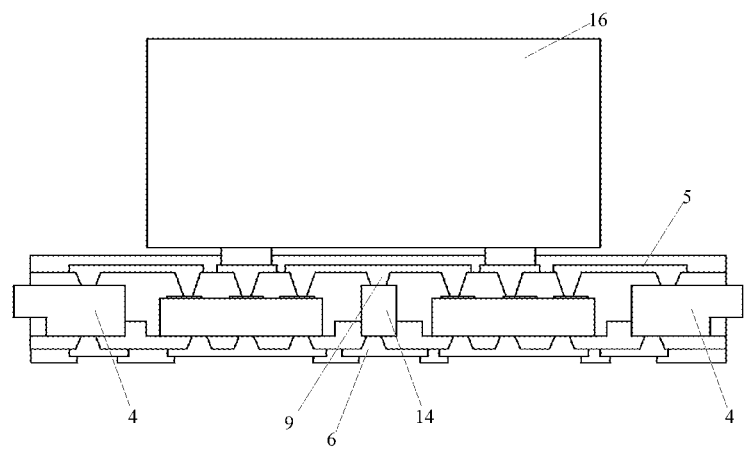
FIG. 10c is a cross-sectional view of a second structure of the chip-embedded package module according to the tenth embodiment of the present disclosure.
Figure 10D:
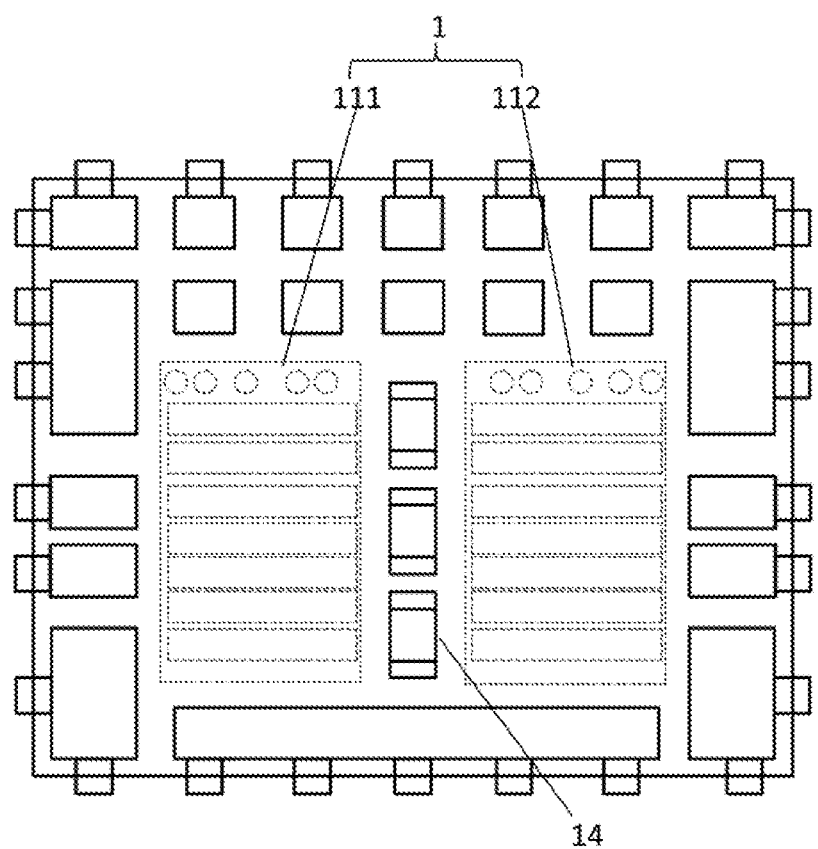
FIG. 10d is a top plan view of FIG. 10c.

FIG. 10a is a cross-sectional view of a first structure of a chip-embedded package module according to a tenth embodiment of the present disclosure; FIG. 10b is a top plan view of FIG. 10a, showing a chip, a metal block, and a capacitor; FIG. 10c is a cross-sectional view of a second structure of the chip-embedded package module according to the tenth embodiment of the present disclosure; and FIG. 10d is a top plan view of FIG. 10c; which showing a chip, a metal block, and a capacitor.

It is not difficult to see from the ninth embodiment that the height of the entire package module is increased due to arrangement of the capacitor 14, in order to solve this problem, optionally, as shown in FIG. 10a and FIG. 10b, if the capacitor 14 is thinner than the chip 1, two electrodes of the capacitor 14 may be soldered on the metal block 4 to compensate for the height difference. Optionally, as shown in FIG. 10c and FIG. 10d, if the capacitor 14 is higher than the chip 1, no metal block 4 should be disposed between two chips 1, instead the capacitor 14 is directly disposed between the two chips 1, and the two electrodes of the capacitor 14 are electrically connected to the metal wiring layer above and below the chip 1 via the conductive hole 9.

The chip-embedded package module according to the tenth embodiment shortens both a circuit path from the capacitor 14 to the input of the module and circuit paths from the capacitor 14 to the two chips 1, and may further enhance efficiency, current equilibrium and ripple cancellation effects thereof. There is no capacitor disposed above the package structure, then the inductor 16 may be directly bonded with the package structure, and the structure may be more compact. Other capacitors may be disposed on at outer side of the chip 1. These capacitors may be input capacitors Cin, output capacitors Co or the like. This structure further enhances current equilibrium effects and ripple cancellation effects when two-phase half-bridge circuits in parallel are worked, it is beneficial to reduce the number of capacitors or capacitance requirements, the structure is more compact and heat dissipation effects are better.

It can be seen from each of the above embodiments that the metal block 4, the PCB substrate 11 or the capacitor 14 is introduced into the package module according to each of the above embodiments in order that upper and lower conduction of the circuit is achieved, so that a double-sided pin-out structure is implemented finally, that is, a double-sided pin-out structure. Among others, the metal block 4, the PCB substrate 11, and the capacitor 14 need to be separately manufactured, which are then bonded to a tape together with the chip 1, and then pressed into the first plastic member 2, the metal block 4, the PCB substrate 11 or the capacitor 14 and the chip 1 are bonded as a whole through the first plastic member 2.

Figure 11A:
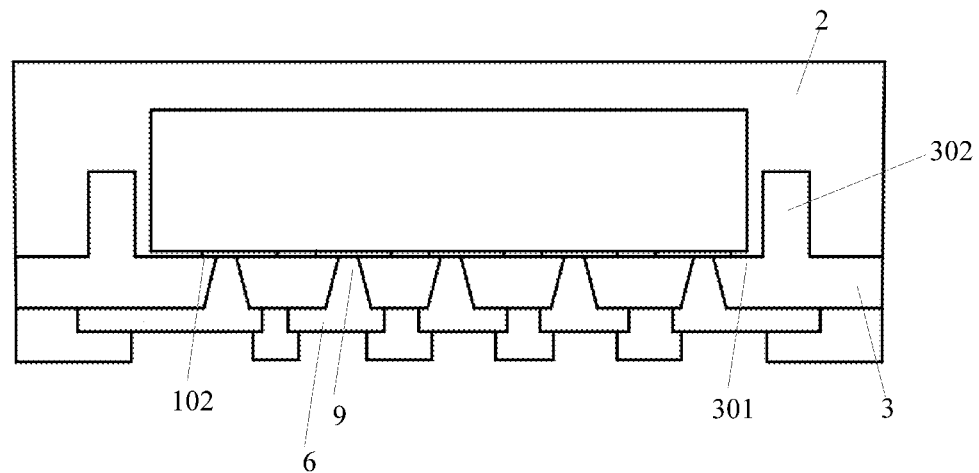
FIG. 11a is a cross-sectional view of a first structure of a chip-embedded package module according to an eleventh embodiment of the present disclosure.
Figure 11B:
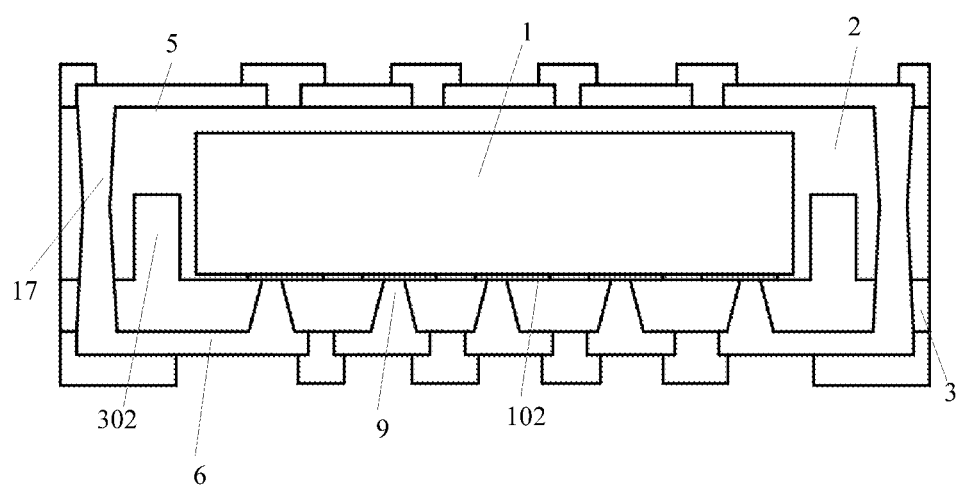
FIG. 11b is a cross-sectional view of a second structure of the chip-embedded package module of the eleventh embodiment of the present disclosure.

FIG. 11a is a cross-sectional view of a first structure of a chip-embedded package module according to an eleventh embodiment of the present disclosure; and FIG. 11b is a cross-sectional view of a second structure of the chip-embedded package module of the eleventh embodiment of the present disclosure.

Optionally, as shown in FIG. 11a, the chip-embedded package module in this embodiment has a single-sided pin-out structure, that is, a single-sided pin structure, and there is no metal block or PCB substrate on a side surface of the chip. Specifically, the conductive hole 9 is disposed on one side of the chip 1, and an electrode on the second surface 102 of the chip 1 is connected to the second metal wiring layer 6 via the conductive hole 9 to achieve single-sided conduction of the chip 1.

Optionally, as shown in FIG. 11b, on the basis of FIG. 11a, in order to achieve the double-sided pin-out structure of the package module, a conductive column 17 with upper and lower conduction is formed inside the first plastic member 2 and the second plastic member 3. The conductive column 17 is electrically connected to the first metal wiring layer 5 and the second metal wiring layer 6. A specific conduction process of the circuit lies in: the power terminal of the chip 1 is electrically connected to the second metal wiring layer 6 via the conductive hole 9 below the second surface 102 of the chip 1, and then is electrically connected to the first metal wiring layer 5 above the chip 1 through conductive columns 17 on both sides of the chip 1 so that upper and lower conduction of the circuit is achieved and the double-sided pin-out structure of the package module is implemented finally. There is no need to introduce other connection structures into the package module, such as a PCB substrate, a metal block, a capacitor, or the like.

In order to avoid the problem in the above structure with regard to the delamination of the second surface 102 of the chip 1 from the second plastic member 3, the second protrusion 302 is disposed on the second plastic member 3 in this embodiment, and the second protrusion 302 extends into the side surface of the chip 1. Since the top surface of the second protrusion 302 and the second surface 102 of the chip 1 form a height difference discontinuous interface structure, the delamination of the chip 1 from the second plastic member 2 is effectively suppressed.

Based on each of the above embodiments, the first plastic member 2 and the second plastic member 3 may each be made of a thermosetting material.

The chip-embedded package module according to the first embodiment to the eleventh embodiment of the present disclosure includes: a chip having a first surface and a second surface that are disposed oppositely; a first plastic member including a first cover portion and a first protrusion, where the first cover portion covers at least a portion of the first surface of the chip, the first protrusion covers a side surface of the chip, and a top surface of the first protrusion is coplanar with the second surface of the chip; and a second plastic member including a second cover portion and the second protrusion, where the second cover portion covers at least a portion of the second surface of the chip, the second protrusion is disposed on the side surface of the chip, and a top surface of the second protrusion is not coplanar with the second surface of the chip. In this way, a height difference discontinuous interface structure is formed between the top surface of the second protrusion and the second surface of the chip the top surface, which splendidly cuts off a passage for expansion of delamination at an edge position of the chip, thereby effectively suppressing generation of the delamination, and solving the problem in the existing package module that the edge position of the chip is delaminated from the insulating plastic packaging material due to mismatch of coefficients of thermal expansion between the chip and the insulating plastic packaging material.

An embodiment of the present disclosure further provides a power module which includes the package module according to the first embodiment to the eleventh embodiment and an inductor 16, where the inductor 16 is electrically connected to a chip of the package module, and the inductor 16 and the package module are disposed in a stacked manner.

Optionally, as shown in FIG. 9a, the power module further includes: a capacitor 14, where the capacitor 14 is electrically connected to the chip of the package module, and the capacitor 14 and the package module are disposed in a stacked manner. Specifically, the capacitor 14 is disposed on one surface of the package module, the inductor 16 is disposed on a side of the capacitor 14 facing away from the package module, and the inductor 16 is electrically connected to the chip through a conductive connection member (such as the copper column 15), where the conductive connection member and the capacitor 14 are co-packaged together in a third plastic member 13, and the inductor 16 is disposed on a side of the third plastic member 13 facing away from the package module, that is to say, the conductive connection member and the capacitor 14 are disposed in the third plastic member 13, the inductor 16 is disposed outside the third plastic member 13 and is located on a side of the third plastic member 13 facing away from the package module.

Optionally, the capacitor 14 and the inductor 16 may also be disposed together on one surface of the package module.

Figure 12:
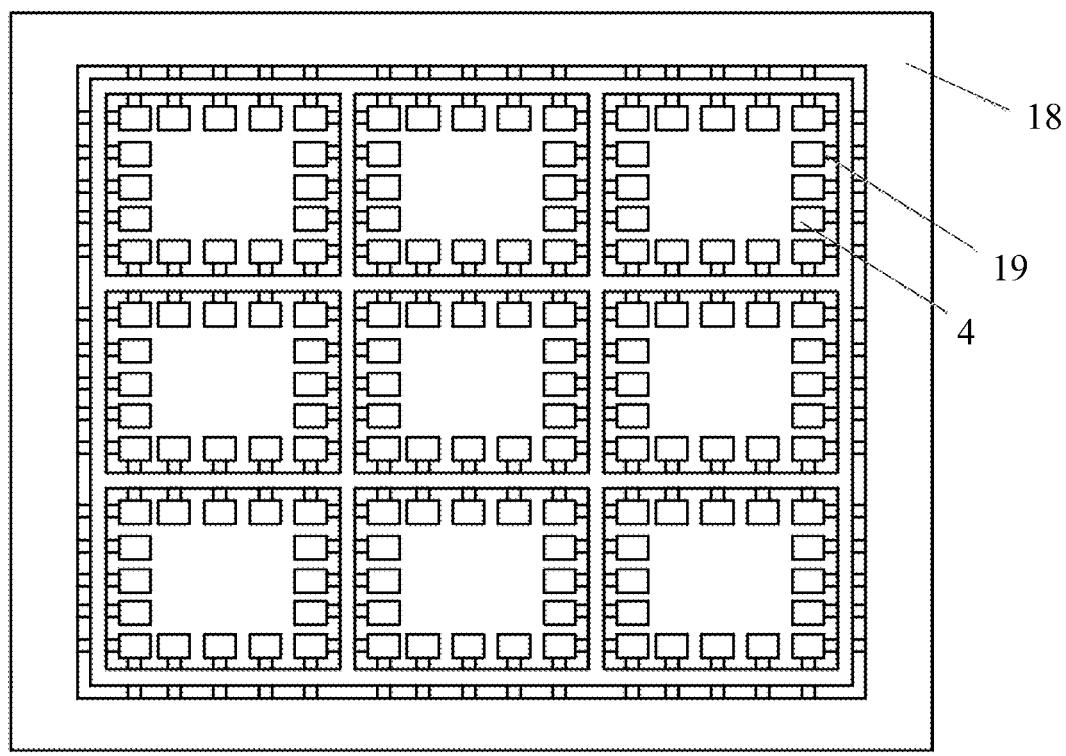
FIG. 12 is a schematic structural view of a metal frame in a manufacturing method of a chip-embedded package module according to a twelfth embodiment of the present disclosure.
Figure 13:
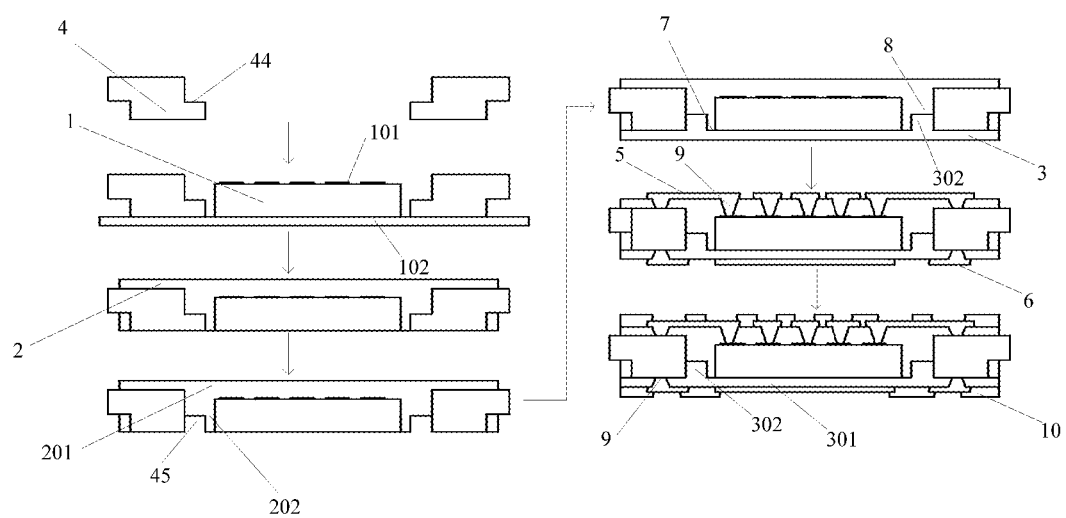
FIG. 13 is a flowchart of a manufacturing method of a chip-embedded package module according to a twelfth embodiment of the present disclosure.

FIG. 12 is a schematic structural view of a metal frame in a manufacturing method of a chip-embedded package module according to a twelfth embodiment of the present disclosure; and FIG. 13 is a flowchart of a manufacturing method of a chip-embedded package module according to a twelfth embodiment of the present disclosure. As shown in FIG. 12 and FIG. 13, an embodiment of the present disclosure provides a manufacturing method of a chip-embedded package module, including:

S101, providing a chip 1;

S102, pressing a first plastic member 2 on a first surface 101 of the chip 1 in such a manner that a first cover portion 201 of the first plastic member 2 covers at least a portion of the first surface 101 of the chip 1, a first protrusion 202 of the first plastic member 2 covers a side surface of the chip 1, and the top surface of the first protrusion 202 is coplanar with a second surface 102 of the chip 1; and S103, pressing a second plastic member 3 on the second surface 102 of the chip 1 in such a manner that a second cover portion 301 of the second plastic member 3 covers at least a portion of the second surface 102 of the chip 1, the second protrusion 302 of the second plastic member 3 is located on the side surface of the chip 1, and the top surface of the second protrusion 302 is not coplanar with the second surface 102 of the chip 1.

Optionally, as shown in FIG. 12, on the basis of the above implementations, before providing the chip 1, the method further includes: providing a metal frame 18 for accommodating the chip 1, where the metal frame 18 is disposed coplanar with the second surface of the above chip. The metal frame 18 is obtained by simultaneously etching both sides (i.e. a front side and a back side) of a copper plate, and the metal frame 18 has a contiguous structure composed of a connector 19 for each package unit. The connector 19 is obtained by half etching.

FIG. 13 illustrates, one of package units is taken as an example, a method for manufacturing a chip-embedded package module according to a twelfth embodiment of the present disclosure. As shown in FIG. 13, before S101, the metal frame 18 is subjected to a roughening treatment so that an irregular or undulating texture is formed on the surface of the metal frame 18, and an interface bonding force between the metal frame 18 and a subsequent insulating material (such as the first plastic member 2 and the second plastic member 3) may be improved.

In S101, the metal block 4 on the metal frame 18 and the chip 1 are attached to the same tape. At this point, the chip 1 is coplanar with the metal block 4, that is, the second surface 102 of the chip 1 is at the same level with a bottom surface of the metal block 4. The metal block 4 includes a boss 44 whose height is lower than the thickness of the chip.

In S102, an insulating material, that is, the first plastic member 2, is pressed into the first surface 101 of the chip 1, which is then solidified to obtain a first cover portion 201 covering the first surface 101 of the chip 1 and a first protrusion 202 covering the side surface of the chip 1. The first plastic member 2 is generally made of a thermosetting material such as an epoxy resin, a silicone resin or the like. The tape is then removed, and a metal boss 44 on the metal frame 18 near a side of the chip 1 is etched using a chemical etching process, with a groove 45 obtained.

In S103, another layer of insulating material, that is, the second plastic member 3, is further pressed into the second surface 102 of the chip 1, which is then solidified to obtain a second cover portion 301 covering the second surface 102 of the chip 1 and the second protrusion 302 located at the side surface of the chip 1.

In this embodiment, a first interface 7 is formed between the top surface of the first protrusion 202 and the second plastic member 3, and a second interface 8 is formed between the top surface of the second protrusion 302 and the first plastic member 2. Since there is a height difference between the first interface 7 and the second interface 8, so that the passages for expansion of delamination at edge positions of the first surface 101 and the second surface 102 of the chip 1 are respectively cut by the first protrusion 202 and the second protrusion 302, thereby effectively suppressing generation of the delamination, and solving the problem in the existing package module that the edge position of the chip is delaminated from the insulating plastic packaging material due to mismatch of coefficients of thermal expansion between the chip and the insulating plastic packaging material. Among others, the first plastic member 2 and the second plastic member 3 may be made of the same material or different materials. Not only the chemical etching process forms a discontinuous interface structure on a side of the chip 1, but also the first protrusion 202 of the first plastic member 2 naturally inherits roughness of the metal block 4, thereby enhancing interface strength of the first interface 7. Therefore, there is no need to additionally add a roughening process to the first plastic member 2 in case that unnecessary damage is made to the chip due to the roughening.

Optionally, the height of the metal boss 44 may less than that of the chip, or equal to or greater than that of the chip so that the structure in the foregoing embodiments is achieved.

Optionally, in order to allow the second protrusion 302 to fill the side surface of the chip 1, in addition to partially etching the metal block 4 on the metal frame 18 as described above, part of the structure of the first protrusion 202 of the first plastic member 2 may be etched in a laser etching manner to form a void for filling the second protrusion 302. At this point, the first protrusion 202 of the first plastic member 2 is still covering the side surface of the chip 1. The laser etching process is shorter in time and more efficient than the chemical etching of the metal block.

In order to allow for conduction between an electrode of the chip and an external circuit, optionally, after S103, laser drilling is performed on the first plastic member 2 on the first surface 101 of the chip 1, that is, above the electrode surface, so that the conductive hole 9 is formed on the first plastic member 2, the first metal wiring layer 5 is then formed on the conductive hole 9 by an electroplating process, and the electrode on the first surface 101 of the chip 1 is connected to the first metal wiring layer 5 via the conductive hole 9 to achieve single-sided conduction of the circuit. Optionally, when the electrode of the chip is located on the second surface 102 of the chip 1, the conductive hole 9 is formed on the second plastic member 3 below the chip 1, and the second metal wiring layer 6 is formed below the conductive hole 9.

In order to achieve upper and lower conduction of the internal circuit of the package module, optionally, the conductive hole 9 is formed on each of the first plastic member 2 and the second plastic member 3, and the first metal wiring layer 5 and the second metal wiring layer 6 are respectively formed on conductive hole 9 above and below the chip 1. At this point, the electrode of the chip may be led to the peripheral metal block 4 through the first metal wiring layer 5, and the electrode of the chip is led to the second metal wiring layer 6 through the metal block 4, thereby achieving the upper and lower conduction of the internal circuit of the package module. Optionally, the first metal wiring layer 5 and/or the second metal wiring layer 6 and the conductive hole 9 are formed in one step by a metallization process.

Optionally, a pad is disposed outside the first metal wiring layer 5 or the second metal wiring layer 6 to form a solder mask layer 10, and an opening is provided on the pad so that the pad on the top of the package module in this embodiment is used as a system substrate for connecting inductors, drives, passive elements, and the like. Optionally, a PCB substrate is used instead of the metal frame.

The twelfth embodiment of the present disclosure provides a manufacturing method of a chip-embedded package module, including: providing a chip; pressing a first plastic member on a first surface of the chip in such a manner that a first cover portion of the first plastic member covers the first surface of the chip, a first protrusion of the first plastic member covers a side surface of the chip, and the top surface of the first protrusion is coplanar with a second surface of the chip; and pressing a second plastic member on the second surface of the chip in such a manner that a second cover portion of the second plastic member covers the second surface of the chip, the second protrusion of the second plastic member is located on the side surface of the chip, and the top surface of the second protrusion is not coplanar with the second surface of the chip. In this way, structure height difference discontinuous interface structure is formed between the top surface of the second protrusion and the second surface of the chip, which splendidly cuts off a passage for expansion of delamination at an edge position of the chip, thereby effectively suppressing generation of the delamination, and solving the problem in the existing package module that the edge position of the chip is delaminated from the insulating plastic packaging material due to mismatch of coefficients of thermal expansion between the chip and the insulating plastic packaging material.

Finally, it should be noted that each of the above embodiments is merely intended to describe the technical solutions of the present disclosure rather than limiting the present disclosure. Although the present disclosure has been described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present disclosure.

What is claimed is:

1. A chip-embedded package module, comprising:
a chip having a first surface and a second surface that are disposed oppositely;
a first plastic member comprising a first cover portion and a first protrusion, wherein the first cover portion covers at least a portion of the first surface of the chip, the first protrusion covers a side surface of the chip, and a bottom surface of the first protrusion is coplanar with the second surface of the chip; and
a second plastic member comprising a second cover portion and a second protrusion, wherein the second cover portion covers at least a portion of the second surface of the chip, the second protrusion is disposed on the side surface of the chip, and a top surface of the second protrusion is not coplanar with the second surface of the chip.

2. The chip-embedded package module according to claim 1, wherein the top surface of the second protrusion is higher than the second surface of the chip, and the top surface of the second protrusion is higher or lower than the first surface of the chip.

3. The chip-embedded package module according to claim 1, wherein the second protrusion is disposed around the side surface of the chip and covers at least a corner of the chip; or
wherein the second protrusion is disposed at least along a side surface on which a short edge of the chip is located.

4. The chip-embedded package module according to claim 1, wherein the first protrusion and the second protrusion are disposed immediately adjacent to each other.

5. The chip-embedded package module according to claim 4, wherein the top surface of the second protrusion abuts against the first plastic member.

6. The chip-embedded package module according to claim 1, wherein the chip comprises a bare die and a conductive metal layer, the conductive metal layer at least partially covers a non-electrode surface opposite to an electrode surface of the bare die;
   wherein the conductive metal layer is directly connected to the outside, or the conductive metal layer is connected to the outside via a conductive hole.

7. The chip-embedded package module according to claim 1, further comprising a conductive member disposed on the side surface of the chip;
   wherein the conductive member is a printed circuit board (PCB) substrate, a metal block or a conductive hole;
   wherein the conductive member comprises a first power pin and a second power pin that are electrically connected to different power terminals of the chip, respectively, and are alternative arranged;
   wherein at least a portion of the second protrusion is located between the conductive member and the chip.

8. The chip-embedded package module according to claim 7, wherein the conductive member is a PCB substrate or a metal block, and a groove is formed on a surface of the conductive member contacting with the second plastic member, and the second protrusion extends into the groove.

9. The chip-embedded package module according to claim 1, further comprising a component disposed on the side surface of the chip, wherein at least a portion of the second protrusion is located between the component and the chip;
   wherein the component is a capacitor or a resistor.

10. The chip-embedded package module according to claim 1, wherein there are a plurality of chips disposed coplanarly between the first plastic member and the second plastic member; at least a portion of the first protrusion and at least a portion of the second protrusion extend to between two adjacent chips;
    wherein the chip-embedded package module further comprises at least one layer of a first metal wiring layer disposed on one surface of the first plastic member facing away from the chip and a surface of the second plastic member facing away from the chip, and at least a portion of the first metal wiring layer is electrically connected to an electrode terminal of the chip.

11. The chip-embedded package module according to claim 10, further comprising:
    at least one layer of a second metal wiring layer, disposed on another one surface of the first plastic member facing away from the chip and a surface of the second plastic member facing away from the chip, wherein at least a portion of the second metal wiring layer is electrically connected to the electrode terminal of the chip.

12. The chip-embedded package module according to claim 11, wherein the plurality of chips comprise a first chip and a second chip adjacently disposed; and the chip-embedded package module further comprises a conductive member, at least a portion of which is disposed between the first chip and the second chip, and is electrically connected to the first metal wiring layer and/or the second metal wiring layer, wherein the conductive member is a PCB substrate, a metal block or a conductive hole.

13. The chip-embedded package module according to claim 12, wherein the conductive member further comprises first power pins and second power pins, wherein the first power pin is electrically connected to a power terminal of the first chip, and the second power pin is electrically connected to a power terminal of the second chip;
    wherein the power terminals comprise first power terminals and second power terminals, the first power pins are electrically connected to a first power terminal of the first chip and a first power terminal of the second chip, and the second power pins are electrically connected to a second power terminal of the first chip and a second power terminal of the second chip;
    wherein the first power pins and the second power pins disposed between the first chip and the second chip are alternative arranged;
    wherein the chip-embedded package module further comprises signal pins and third power pins, the signal pins are arranged around the chip in an array manner, and the third power pins are disposed around the chip.

14. The chip-embedded package module according to claim 11, further comprising:
    a capacitor, at least a portion of which is disposed between the two adjacent chips and is electrically connected to the first metal wiring layer and the second metal wiring layer;
    wherein the first metal wiring layer and the second metal wiring layer have a same number of layers.

15. The chip-embedded package module according to claim 1, wherein the first plastic member and the second plastic member are both made of a thermosetting material.

16. A power module, comprising: the package module according to claim 1 and an inductor, wherein the inductor is electrically connected to the chip of the package module, and the inductor and the package module are disposed in a stacked manner.

17. The power module according to claim 16, wherein the power module further comprising: a capacitor, electrically connected to the chip of the package module, and the capacitor and the package module are disposed in a stacked manner.

18. The power module according to claim 17, wherein the capacitor is disposed on one surface of the package module, the inductor is disposed on a side of the capacitor facing away from the package module, and the inductor is electrically connected to the chip through a conductive connection member, wherein the conductive connection member and the capacitor are co-packaged together in a third plastic member, and the inductor is disposed outside the third plastic member; or
    wherein the capacitor and the inductor are disposed together on one surface of the package module.

19. A manufacturing method of a chip-embedded package module, comprising:
    providing a chip;
    pressing a first plastic member on a first surface of the chip in such a manner that a first cover portion of the first plastic member covers at least a portion of the first surface of the chip, and a first protrusion of the first plastic member covers a side surface of the chip, and a bottom surface of the first protrusion is coplanar with a second surface of the chip; and
    pressing a second plastic member on the second surface of the chip in such a manner that a second cover portion of the second plastic member covers at least a portion of the second surface of the chip, a second protrusion of the second plastic member is located on the side surface of the chip, and a top surface of the second protrusion is not coplanar with the second surface of the chip.

20. The manufacturing method according to claim 19, before providing the chip, further comprising: providing a metal frame or a printed circuit board (PCB) substrate for accommodating the chip, wherein the metal frame or the PCB substrate is disposed coplanar with the second surface of the chip;

wherein before providing the metal frame, the metal frame is subjected to a surface roughening treatment.

21. The manufacturing method according to claim 20, further comprising:

after pressing the first plastic member into the metal frame or the PCB substrate and the first surface of the chip, etching a side of the metal frame or a side of the PCB substrate close to the second surface of the chip, and then pressing the second plastic member in such a manner that the second protrusion of the second plastic member fills an etched portion of the metal frame or an etched portion of the PCB substrate; or etching a surface of the first plastic member aligned with the second surface of the chip, and then pressing the second plastic member in such a manner that the second protrusion of the second plastic member fills an etched portion of the first plastic member, and the first protrusion of the first plastic member still covers the side surface of the chip.

22. The manufacturing method according to claim 21, further comprising:

forming a conductive hole in the first plastic member and/or the second plastic member, and forming a first metal wiring layer and/or a second metal wiring layer on the conductive hole, wherein the first metal wiring layer and/or the second metal wiring layer and the conductive hole are formed in one step by a metallization process.

* * * * *